United States Patent [19]
Miyamoto et al.

[11] Patent Number: 6,054,853
[45] Date of Patent: Apr. 25, 2000

[54] MULTI-SLICE MR IMAGING METHOD AND APPARATUS

[75] Inventors: Shoei Miyamoto; Koichi Oshio; Susumu Kosugi, all of Tokyo, Japan

[73] Assignee: GE Yokogawa Medical Systems, Limited, Tokyo, Japan

[21] Appl. No.: 09/122,403

[22] Filed: Jul. 25, 1998

[30] Foreign Application Priority Data

Oct. 30, 1997 [JP] Japan ..................................... 9-298293

[51] Int. Cl.$^7$ ...................................................... G01V 3/00

[52] U.S. Cl. .......................... 324/309; 324/307; 324/318; 324/300; 600/419

[58] Field of Search ..................................... 324/309, 307, 324/318, 300, 306; 128/653.2, 653.3, 653.4; 600/419

[56] References Cited

U.S. PATENT DOCUMENTS

| | | | |
|---|---|---|---|
| 4,703,268 | 10/1987 | Gyngell et al. | 324/309 |
| 5,818,229 | 10/1998 | Kanazawa | 324/309 |

FOREIGN PATENT DOCUMENTS 60-151548  8/1985  Japan .

*Primary Examiner*—Christine K. Oda
*Assistant Examiner*—Brij B. Shrivastav
*Attorney, Agent, or Firm*—Moonray Kojima

[57] ABSTRACT

In order to enable the application of a forcible recovery pulse to the multi-slice technique, when selective inversion pulses satisfy the CPMG condition or the CP condition and ETL (Echo Train Length) is even, a dummy selective inversion pulse is applied at the end of each pulse sequence of the fast spin echo technique for each slice, then a dummy read axis gradient is applied without acquiring MR data, then a refocusing pulse selective of only the current slice is applied, and subsequently a forcible recovery pulse sequence FR selective of only the current slice is applied.

10 Claims, 5 Drawing Sheets

100
MRI apparatus

MULTI-SLICE MR IMAGING METHOD AND APPARATUS

BACKGROUND OF THE INVENTION

The present invention relates to a multi-slice MR (Magnetic Resonance) imaging method and apparatus in which a forcible recovery pulse can be practically applied to the "multi-slice technique".

In Japanese Patent Application No. 2-45448 (1990) (Japanese Patent Application Laid Open No. 60-151548 (1985)), a method is disclosed which comprises the steps of repeating a pulse sequence in a repeat time TR while varying a phase encoding gradient so as to fill k-space, the pulse sequence applying a first 90° pulse (selective excitation pulse) and n 180° pulses (non-selective inversion pulses) to acquire n sets of MR data in parallel which are different in $T_2$ relaxation; acquiring the MR data sets in parallel which respectively fill n k-spaces (multi-echo technique) to obtain simultaneously n images which are different in contrast; and, subsequent to the pulse sequence of the multi-echo technique, applying a 180° pulse (non-selective inversion pulse), and then applying a second 90° pulse (selective excitation pulse) if n is odd, or a second 90° pulse and a subsequent 180° pulse (non-selective inversion pulse) if n is even, thereby enabling the repeat time TR to be shortened.

The distinction between "selective" and "non-selective" as regards the above-described selective excitation pulse and non-selective inversion pulse is defined as follows: "Selective" refers to the case in which a gradient magnetic field is applied simultaneously with an RF (Radio Frequency) pulse to validate the RF pulse for only an object slice to be imaged; and "non-selective" refers to the case in which an RF pulse is applied without simultaneously applying a gradient magnetic field, thus validating the RF pulse for slices other than the object slice to be imaged.

In addition, the second 90° pulse, and the second 90° pulse and the subsequent 180° pulse are referred to as "forcible recovery pulses" because these pulses are for forcibly turning the residual transverse magnetization after data acquisition back to longitudinal magnetization.

Japanese Patent Application No. 2-45448 (Laid Open No. 60-151548) mentioned above discloses a method in which the forcible recovery pulse for forcibly turning transverse magnetization back to longitudinal magnetization is applied to the "multi-echo technique" and furthermore, suggests application of the forcible recovery pulse to the "multi-slice technique".

However, since the method disclosed in Japanese Patent Application No. 2-45448 (Laid Open No. 60-151548) employs non-selective inversion pulses, it cannot be practically applied to the "multi-slice technique".

SUMMARY OF THE INVENTION

It is an object of the present invention to provide a multi-slice MR imaging method and apparatus in which a forcible recovery pulse can be practically applied to the "multi-slice technique".

In accordance with a first aspect, the present invention provides a multi-slice MR imaging method in which a pulse sequence for acquiring N ($\geq 1$) sets of MR data is executed sequentially for M ($\geq 2$) slices whose locations are different and the sequential execution is repeated in a repeat time TR, the method comprising the steps of: subsequent to each pulse sequence for each slice within the repeat time TR, applying a refocusing pulse selective of only a current slice; and then applying a forcible recovery pulse sequence selective of the current slice.

In the above configuration, the forcible recovery pulse sequence refers to, for example, a sequence which applies a rephasing gradient to each of the slice and read axes, and then applies a selective −90° pulse (in this case, the selective −90° pulse is referred to as a forcible recovery pulse), or a sequence which applies a rephasing gradient to each of the slice and read axes, then applies a selective 90° pulse, and subsequently applies a similarly selective −180° pulse (in this case, the selective 90° pulse and the selective −180° pulse are referred to as forcible recovery pulses).

In the multi-slice MR imaging method according to the first aspect, a refocusing pulse and a forcible recovery pulse sequence which are selective of only a current slice are applied subsequent to each pulse sequence for each slice within a repeat time TR. Therefore, the influence of the forcible recovery pulse for a particular slice on the other slices can be suppressed. Only when this is implemented, can the forcible recovery pulse be practically applied to the "multi-slice technique".

In accordance with a second aspect, the present invention provides the multi-slice MR imaging method as described regarding the first aspect, wherein the pulse sequence is according to a fast spin echo technique in which a selective excitation pulse is applied and then n ($\geq 2$) selective inversion pulses are applied while varying a phase encoding gradient to sequentially acquire n sets of MR data which are different in the amount of phase encoding.

In the multi-slice MR imaging method according to the second aspect, the forcible recovery pulse can be applied to the "multi-slice technique" of the fast spin echo technique. "n" is called ETL (Echo Train Length).

In accordance with a third aspect, the present invention provides the multi-slice MR imaging method as described regarding the second aspect, wherein: when the selective inversion pulses satisfy the CPMG (Carr-Purcell-Meiboom-Gill) condition or the CP (Carr-Purcell) condition and n is even, subsequent to each pulse sequence for each slice in the repeat time TR, a dummy selective inversion pulse is applied, then a dummy read axis gradient is applied without acquiring MR data, then a refocusing pulse selective of only a current slice is applied and, as the forcible recovery pulse sequence selective of only the current slice, a rephasing gradient is applied to each of the slice and read axes and subsequently a selective −90° pulse is applied.

Magnetization immediately before the application of the last selective −90° pulse must be aligned with the y-axis, and the all spins must be focused. Accordingly, if the selective inversion pulses satisfy the CPMG or CP condition, the number of 180° pulses counted from the selective inversion pulse to tie selective 180° pulse is required to be even. In other words, the number of the selective inversion pulses which are applied prior to the selective 180° pulse is required to be odd. However, in case that n is even, the number of the selective inversion pulses is even.

Then, in the multi-slice MR imaging method according to the third aspect, the dummy selective inversion pulse is applied to make the number of the selective inversion pulses applied prior to the selective 180° pulse odd. This enables transverse magnetization to be suitably turned back to longitudinal magnetization even if the selective inversion pulses satisfy the CPMG or CP condition. In case that n is odd, the dummy selective inversion pulse need not be applied because the number of the selective inversion pulses is odd.

In accordance with a fourth aspect, the present invention provides the multi-slice MR imaging method as described regarding the second aspect, wherein: when the selective inversion pulses satisfy the CPMG condition or the CP condition and n is even, subsequent to each pulse sequence for each slice in the repeat time TR, a refocusing pulse selective of only a current slice is applied, then, as the forcible recovery pulse sequence selective of only the current slice, a rephasing gradient is applied to each of the slice and read axes, and subsequently a 90° pulse selective of only the current slice is applied after a time period of ESP/2 from the refocusing pulse, and subsequently a −180° pulse selective of only the current slice is applied.

In the above configuration, ESP (Echo SPace) refers to the time period from the selective excitation pulse to the time at which the echo is focused.

In the multi-slice MR imaging method according to the fourth aspect, after the time period of ESP/2 from the application of the refocusing pulse, transverse magnetization is focused on the y-axis. The application of the selective 90° pulse at this time point causes the transverse magnetization to be turned into longitudinal magnetization in the −z-direction. The subsequent application of the selective −180° pulse causes the longitudinal magnetization in the −z-direction to be turned back to longitudinal magnetization in the +z-direction. This enables transverse magnetization to be turned back to longitudinal magnetization in a time period shorter than in the multi-slice MR imaging method according to the third aspect.

In accordance with a fifth aspect, the present invention provides the multi-slice MR imaging method as described regarding the first–fourth aspects, wherein the central frequencies and the phases of the selective excitation pulse, the selective inversion pulses, the refocusing pulse, and the RF pulses in the forcible recovery pulse sequence are varied according to the slice location.

When a slice lies at the magnetic center (a location at which the gradient magnetic field strength is 0), assume that the central frequency of an RF pulse is defined as a reference. When a slice lies at a distance of sloc from the magnetic center, assuming that the offset of the central frequency of the selective excitation pulse from the reference is represented as $\Delta f_{90}$, the offset of the central frequency of the selective inversion pulse and selective 180° pulse from the reference is represented as $\Delta f_{180}$, the offset of the central frequency of the selective −90° pulse from the reference is represented as $\Delta f_{-FR}$, and the offset of the central frequency of the selective 90° pulse from the reference is represented as $\Delta f_{FR}$, the following equations hold under the CPMG condition:

$$\Delta f_{90} = \gamma \times g_{90} \times sloc, \quad (1)$$

$$\Delta f_{180} = \gamma \times g_{180} \times sloc, \quad (2)$$

$$\Delta f_{-FR} = \gamma \times g_{-FR} \times sloc, \text{ and} \quad (3)$$

$$\Delta f_{FR} = \gamma \times g_{FR} \times sloc, \quad (4)$$

wherein $\gamma$ is the gyromagnetic ratio, $g_{90}$ is the slope of the gradient magnetic field with respect to the selective excitation pulse, $g_{180}$ is the slope of the gradient magnetic field with respect to the selective inversion pulse and selective 180° pulse, $g_{-FR}$ is the slope of the gradient magnetic field with respect to the selective −90° pulse, and $g_{FR}$ is the slope of the gradient magnetic field with respect to the selective 90° pulse. Furthermore, defining the time period from the application of the RF pulses at the above-described frequencies to the pulse peak as "iso delay", i.e., $iso_{90}$, $iso_{180}$, $iso_{-FR}$ and $iso_{FR}$, respectively, and assuming that the phase difference between the selective excitation pulse, and the selective inversion pulse and selective 180° pulse is represented as $\Delta P_{90-180}$, the phase difference between the selective 180° pulse and the selective −90° pulse is represented as $\Delta P_{180\text{-}FR}$, and the phase difference between the selective 180° pulse and the selective 90° pulse is represented as $\Delta P_{180\text{-}FR}$, the following equations are obtained:

$$\Delta P_{90-180} = 2 \times \pi (\Delta f_{90} \times iso_{90} - \Delta f_{180} \times iso_{180}), \quad (5)$$

$$\Delta P_{180\text{--}FR} = 2 \times \pi (\Delta f_{180} \times iso_{180} - \Delta f_{-FR} \times iso_{-FR}), \text{ and} \quad (6)$$

$$\Delta P_{180-FR} = 2 \times \pi (\Delta f_{180} \times iso_{180} - \Delta f_{FR} \times iso_{FR}). \quad (7)$$

Therefore, defining the phase of the selective inversion pulse and selective 180° pulse as a reference, for example, the respective phases of the RF pulses $P_{90}$, $P_{180}$, $P_{-FR}$ and $P_{FR}$ are given as follows:

$$P_{90} = -\Delta P_{90-180}, \quad (8)$$

$$P_{180} = \pi/2, \quad (9)$$

(with the proviso that when the −180° pulse is employed subsequent to the +90° pulse as shown in FIG. 7, the phase of the last −180° pulse is $\pi$.)

$$P_{-FR} = \pi + \Delta P_{180\text{--}FR}, \text{ and} \quad (10)$$

$$P_{FR} = \Delta P_{180-FR}. \quad (11)$$

On the other hand, under the CP condition, magnetization must be aligned with the y-axis and the all spins must be focused immediately before the application of the −90° pulse for forcible recovery, in the same way as under the CPMG condition. However, because the sign of the NMR (Nuclear Magnetic Resonance) signal alternately inverts between positive and negative on the y-axis, the phases need to be adjusted according to whether the current selective inversion pulse or the current selective 180° pulse is odd-numbered or even-numbered. That is, defining the phase of the selective inversion pulse and selective 180° pulse as a reference, for example, the respective phases of the RF pulses $P_{90}$, $P_{180}$ and $P_{-FR}$ are given as follows:

$$P_{90} = -\Delta P_{90-180}, \quad (12)$$

$$P_{180} = 0 \text{ (when odd-numbered);} \quad (13)$$

$$\pi \text{ (when even-numbered), and}$$

$$P_{-FR} = \pi + \Delta P_{180\text{--}FR}, \quad (14)$$

if n is odd, or n is even and a dummy selective inversion pulse is employed; and $$P_{90} = -\Delta P_{90-180}, \quad (15)$$

$$P_{180} = 0 \text{ (when odd-numbered);} \quad (16)$$

$$\pi \text{ (when even-numbered),}$$

(with the proviso that $P_{180}$ is 0 for the −180° pulse as the forcible recovery pulse), and $$P_{-FR} = \pi + \Delta P_{180--FR}, \quad (17)$$

if n is even (i.e., the −180° pulse subsequent to the +90° pulse is employed as the forcible recovery pulse as shown in FIG. 7).

If n is even, a dummy selective inversion pulse and a dummy read axis gradient are employed to make the number of 180° pulses even, in the same way as under the CPMG condition, or a 180° pulse subsequent to a −90° pulse is employed instead of using the dummy selective inversion pulse.

In the multi-slice MR imaging method according to the fifth aspect, the central frequency f and the phase P are varied according to the slice location sloc based on the above equations, and hence the method can be suitably applied to the multi-slice technique.

In accordance with a sixth aspect, the present invention provides an MRI (Magnetic Resonance Imaging) apparatus having multi-slice data acquisition means for executing a pulse sequence for acquiring N (≧1) sets of MR data sequentially for M (≧2) slices whose locations are different and repeating the sequential execution in a repeat time TR, the MRI apparatus comprising selective forcible recovery means which, subsequent to each pulse sequence for each slice within the repeat time TR, applies a refocusing pulse selective of only a current slice, and then applies a forcible recovery pulse sequence selective of only the current slice.

The MRI apparatus as described regarding the sixth aspect can suitably implement the MR imaging method according to the first aspect.

In accordance with a seventh aspect, the present invention provides the MRI apparatus as described regarding the sixth aspect, wherein the pulse sequence is according to a fast spin echo technique in which a selective excitation pulse is applied and then n (≧2) selective inversion pulses are applied while varying a phase encoding gradient to sequentially acquire n sets of MR data which are different in the amount of phase encoding.

The MRI apparatus as described regarding the seventh aspect can suitably implement the MR imaging method according to the second aspect.

In accordance with an eighth aspect, the present invention provides the MRI apparatus as described regarding the seventh aspect, wherein: when the selective inversion pulses satisfy the CPMG condition or the CP condition and n is even, the selective forcible recovery means applies, subsequent to each pulse sequence for each slice in the repeat time TR, a dummy selective inversion pulse, then applies a dummy read axis gradient without acquiring MR data, then applies a refocusing pulse selective of only a current slice and, as the forcible recovery pulse sequence selective of only the current slice, applies a rephasing gradient to each of the slice and read axes and subsequently a selective −90° pulse.

The MRI apparatus as described regarding the eighth aspect can suitably implement the MR imaging method according to the third aspect.

In accordance with a ninth aspect, the present invention provides the MRI apparatus as described regarding the seventh aspect, wherein: when the selective inversion pulses satisfy the CPMG condition or the CP condition and n is even, the selective forcible recovery means applies, subsequent to each pulse sequence for each slice in the repeat time TR, a refocusing pulse selective of only a current slice, then applies, as the forcible recovery pulse sequence selective of only the current slice, a rephasing gradient to each of the slice and read axes, and subsequently a 90° pulse selective of only the current slice after the time period of ESP/2 from the refocusing pulse, and subsequently a −180° pulse selective of only the current slice.

The MRI apparatus as described regarding the ninth aspect can suitably implement the MR imaging method according to the fourth aspect.

In accordance with a tenth aspect, the present invention provides the MRI apparatus as described regarding the sixth–ninth aspects, wherein the multi-slice data acquisition means varies the central frequencies and the phases of the selective excitation pulse and the selective inversion pulses according to the slice location, and the selective forcible recovery means varies the central frequencies and the phases of the refocusing pulse and the RF pulses in the forcible recovery pulse sequence according to the slice location.

The MRI apparatus as described regarding the tenth aspect can suitably implement the MR imaging method according to the fifth aspect.

Thus, according to the MR imaging method and apparatus of the invention, the influence of the forcible recovery pulse for a particular slice on the other slices can be suppressed, thereby enabling the forcible recovery pulse to be practically applied to the multi-slice technique.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to several embodiments shown in the accompanying drawings hereinafter.

First Embodiment

Figure 1:
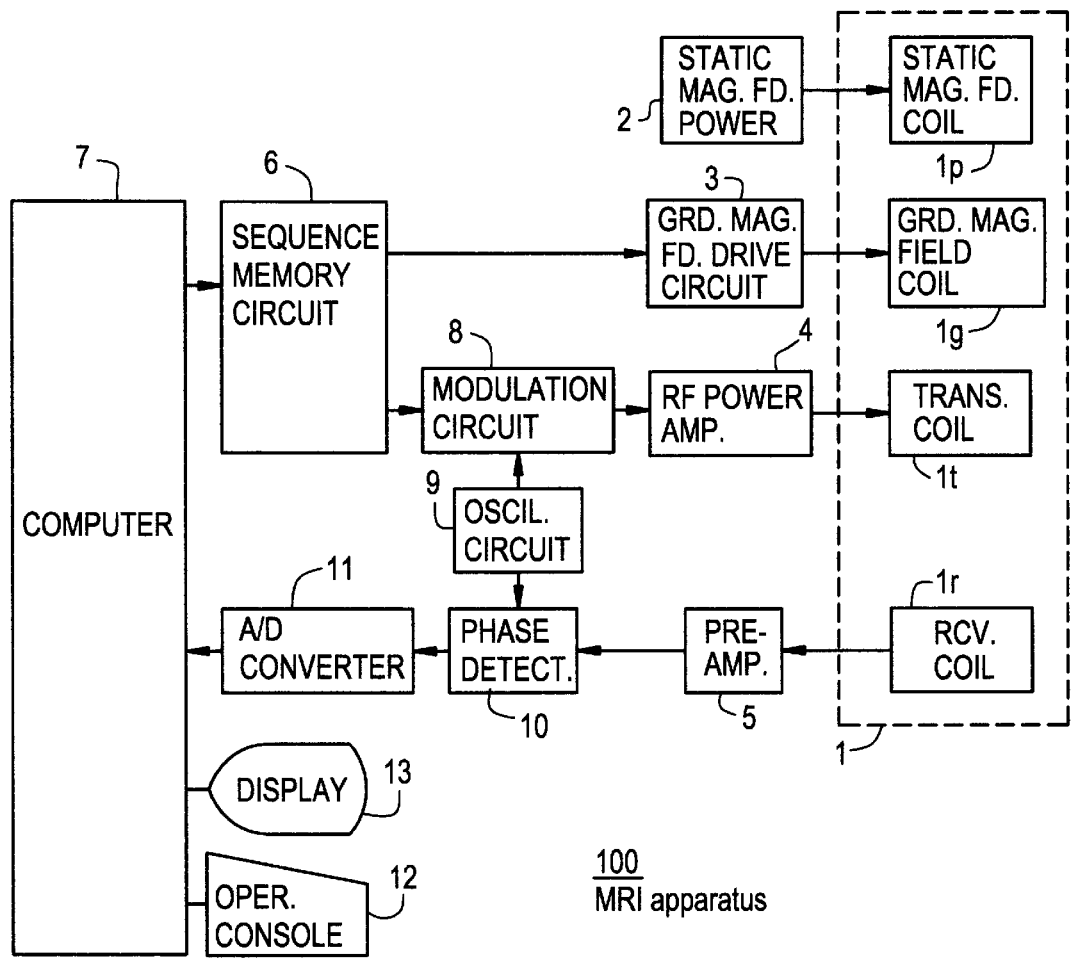
FIG. 1 is a block diagram illustrating an MRI apparatus in accordance with a first embodiment of the present invention.

FIG. 1 is a block diagram illustrating an MRI apparatus in accordance with a first embodiment of the present invention.

In the MRI apparatus 100, a magnet assembly 1 has a cavity portion (bore) through which a subject is inserted, and surrounding the cavity portion, there are provided a static magnetic field coil 1p which applies a constant static magnetic field to the subject, a gradient magnetic field coil 1g (comprising x-, y-, and z-axis coils) for generating a gradient magnetic field, a transmit coil it for applying MT pulses or excitation pulses to the subject, and a receive coil 1 which detects NMR signals from the subject. The static magnetic field coil 1p is connected to a static magnetic field power supply 2, the gradient magnetic field coil 1g is connected to a gradient magnetic field drive circuit 3, the transmit coil 1t is connected to an RF power amplifier 4, and the receive coil 1r is connected to a preamplifier 5.

In response to a command from a computer 7, a sequence memory circuit 6 operates the gradient magnetic field drive circuit 3 based on a pulse sequence according to, for example, the fast spin echo technique employing a forcible recovery pulse, to generate a gradient magnetic field from the gradient magnetic field coil 1g in the magnet assembly 1, and operates a gate modulation circuit 8 to modulate a high frequency output signal supplied from an RF oscillation circuit into a pulsed signal which has a predetermined timing and a predetermined envelope. The pulsed signal is applied to the RF power amplifier 4 as the MT pulse or the excitation pulse etc., power-amplified by the RF power amplifier 4, and applied to the transmit coil 1t in the magnetic assembly 1 to transmit the RF pulse.

The preamplifier 5 amplifies the NMR signal detected from the subject by the receive coil 1r in the magnetic assembly 1 and supplies it to a phase detector 10. The phase detector 10 phase-detects the NMR signal from the preamplifier 5 using an output from the RF oscillation circuit 9 as a reference signal, and supplies the detected NMR signal to an A/D (analog-to-digital) converter 11. The A/D converter 11 converts an analog signal obtained by the phase-detection into MR data in digital signal form and supplies it to the computer 7.

The computer 7 performs an image reconstruction operation on the MR data to produce an image (such as a proton density image). The image is presented on a display 13.

The computer 7 also performs the overall control such as receiving information supplied from an operator console 12.

Moreover, the computer 7 calculates the central frequencies and the phases of the selective excitation pulse and the selective inversion pulses according to the slice location, designs a pulse sequence to be applied while assigning the N MT pulses to one excitation pulse, and passes the pulse sequence to the sequence memory circuit 6.

The computer 7 and the sequence memory circuit 6 correspond to the multi-slice data acquisition means and the selective forcible recovery pulse application means.

Figure 2:
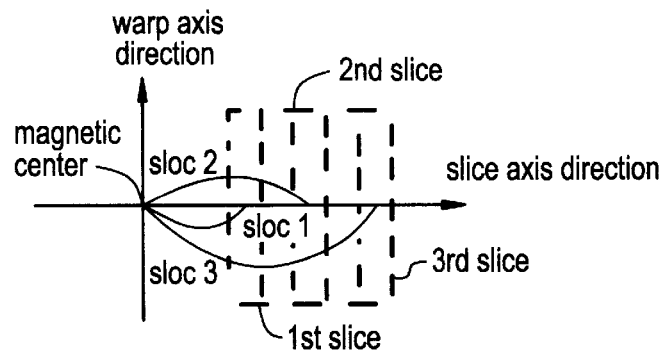
FIG. 2 is an explanatory diagram illustrating the locations of slices 1–3.
Figure 3:
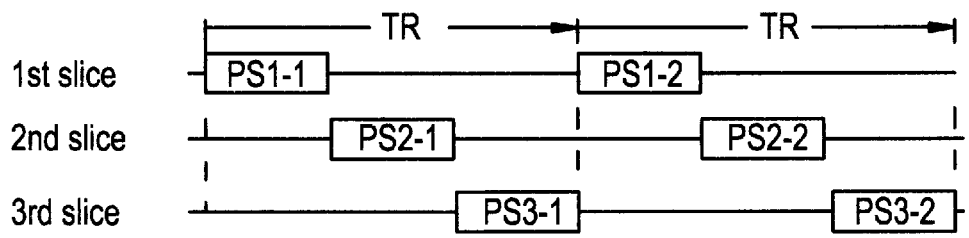
FIG. 3 is a time chart illustrating the repetition of the respective pulse sequences for the slices 1–3.

In case of a multi-slice technique in which the MR data sets for slices 1–3 are acquired in parallel as shown n FIG. 2, a pulse sequence PS1 for acquiring the MR data set for slice 1, a pulse sequence PS2 for slice 2 and a pulse sequence PS3 for slice 3 are sequentially executed, and the execution is repeated in a repeat time TR while varying a phase encoding gradient so as to fill k-space of each slice, as shown in FIG. 3.

Figure 4:
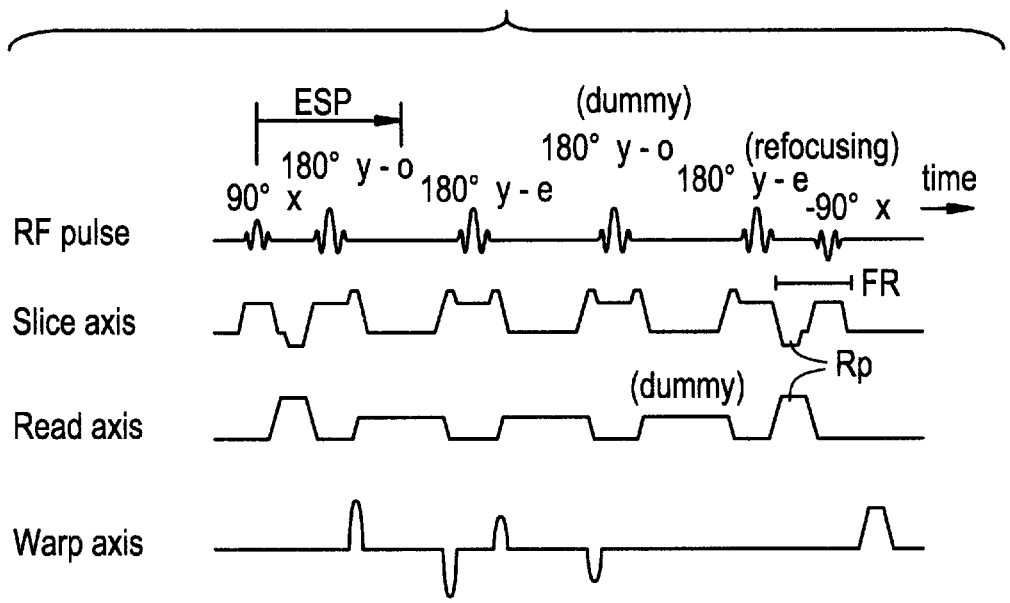
FIG. 4 is a diagram illustrating a pulse sequence of the fast spin echo technique (when n is even) in accordance with the first embodiment of the present invention.
Figure 5A:
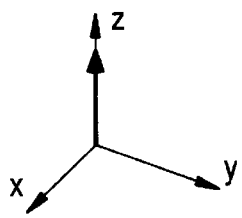
FIG. 5 is an explanatory diagram illustrating the behavior of magnetization in response to the pulse sequence shown in FIG. 4.
Figure 5B:
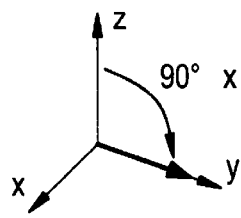
Figure 5C:
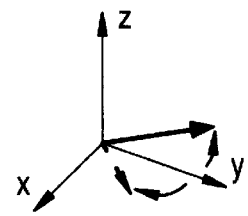
Figure 5D:
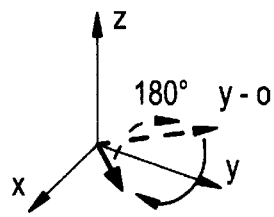
Figure 5E:
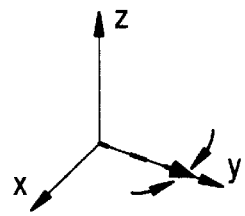
Figure 5F:
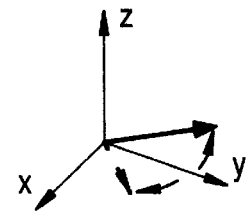
Figure 5G:
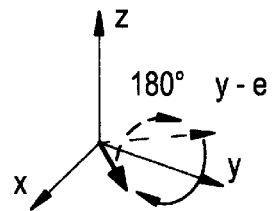
Figure 5H:
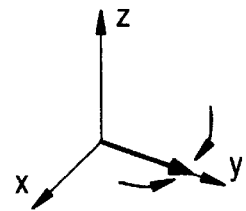
Figure 5I:
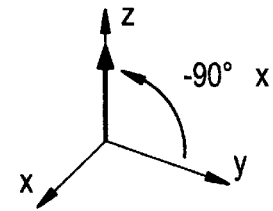

FIG. 4 is a diagram illustrating a pulse sequence in which the forcible recovery pulse is employed in the fast spin echo technique with the number of MR data sets=2.

(1) A selective excitation pulse 90° x which rotates longitudinal magnetization of an object slice for MR data acquisition by 90° around the x-axis to generate transverse magnetization is applied.

(2) A selective inversion pulse 180° y which rotates the transverse magnetization of the object slice for MR data acquisition by 180° around the y-axis is applied and the NMR signal is received. This step is repeated twice. (By "-o" is meant "odd numbered", and by "-e" is meant "even-numbered".)

(3) A dummy selective inversion pulse 180° y-o is applied, and subsequently a dummy read axis gradient is applied without acquiring MR data.

(4) A selective refocusing pulse 180° y-e which rotates the transverse magnetization of the object slice for MR data acquisition by 180° around the y-axis is applied.

(5) As the forcible recovery pulse sequence FR, a rephasing gradient Rp is applied to each of the slice and read axes and subsequently, after the time period of ESP/2 (when the transverse magnetization is focused on the y-axis) from the refocusing pulse 180° y-e, a selective −90° pulse −90° x which rotates the transverse magnetization of the object slice for MR data acquisition by −90° around the x-axis is applied.

The central frequencies and the phases of the selective excitation pulse 90° x, the selective inversion pulse 180° y, the selective refocusing pulse 180° y-e and the selective −90° pulse −90° x are determined by the slice locations sloc1–sloc3 and Eqs. (1), (2) and (3), Eqs. (5) and (6), and Eqs. (8), (9) and (10).

FIG. 5 is an explanatory diagram illustrating the behavior of magnetization in response to the pulse sequence shown in FIG. 4.

(a) The magnetization is longitudinal and oriented to the direction of the static magnetic field.

(b) The magnetization becomes transverse and oriented to the y-direction by the selective excitation pulse 90° x.

(c) The transverse magnetization is dephased.

(d) The magnetization is rotated by 180° around the y-axis by the first selective inversion pulse 180° y-o.

(e) The transverse magnetization is focused on the y-axis: The NMR signal is received.

(f) The transverse magnetization is dephased.

(g) The magnetization is rotated by 180° around the y-axis by the second selective inversion pulse 180° y-e.

(h) The transverse magnetization is focused on the y-axis: The NMR signal is received.

• Then this process returns to (c), goes to (d) by the dummy selective inversion pulse 180° y-o, then goes to (e)–(f), subsequently goes to (g) by the selective refocusing pulse 180° y-e, then goes to (h) and the transverse magnetization is focused on the y-axis.

(i) The transverse magnetization is rotated by −90° around the x-axis to recover longitudinal magnetization by the forcible recovery pulse, i.e., the selective −90° pulse −90° x.

According to the above-described first embodiment, the forcible recovery pulse can be applied to the multi-slice fast spin echo technique.

Second Embodiment

Figure 6:
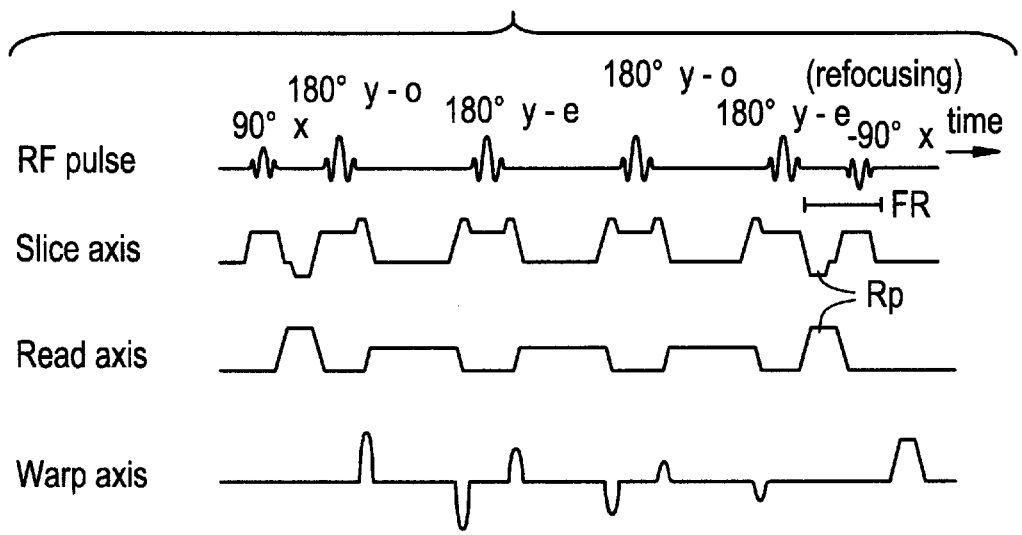
FIG. 6 is a diagram illustrating a pulse sequence of the fast spin echo technique (when n is odd) in accordance with a second embodiment of the present invention.

FIG. 6 is a diagram illustrating a pulse sequence in which the forcible recovery pulse Is employed in the fast spin echo technique with the number of MR data sets=3.

(1) A selective excitation pulse 90° x which rotates longitudinal magnetization of an object slice for MR data acquisition by 90° around the x-axis to generate transverse magnetization is applied.

(2) A selective inversion pulse 180° y which rotates the transverse magnetization of the object slice for MR data acquisition by 180° around the y-axis is applied and the NMR signal is received. This step is repeated thrice. (By "-o" is meant "odd numbered", and by "-e" is meant "even-numbered".)

(3) A selective refocusing pulse 180° y-e which rotates the transverse magnetization of the object slice for MR data acquisition by 180° around the y-axis is applied.

(4) As the forcible recovery pulse sequence FR, a rephasing gradient Rp is applied to each of the slice and read axes and subsequently, after the time period of ESP/2 (when the transverse magnetization is focused on the y-axis) from the refocusing pulse 180° y-e, a selective −90° pulse −90° x which rotates the transverse magnetization of the object slice for MR data acquisition by −90° around the x-axis is applied.

The central frequencies and the phases of the selective excitation pulse 90° x, the selective inversion pulse 180° y, the selective refocusing pulse 180° y-e and the selective −90° pulse −90° x are determined by the slice locations sloc1–sloc3 and Eqs. (1), (2) and (3), Eqs. (5) and (6), and Eqs. (8), (9) and (10).

The behavior of magnetization is the same as shown in FIG. 5 except that the third selective inversion pulse 180° y-o is applied to acquire the MR data, instead of the dummy selective inversion pulse.

According to the above-described second embodiment, the forcible recovery pulse FR can be applied to the multi-slice fast spin echo technique.

Third Embodiment

Figure 7:
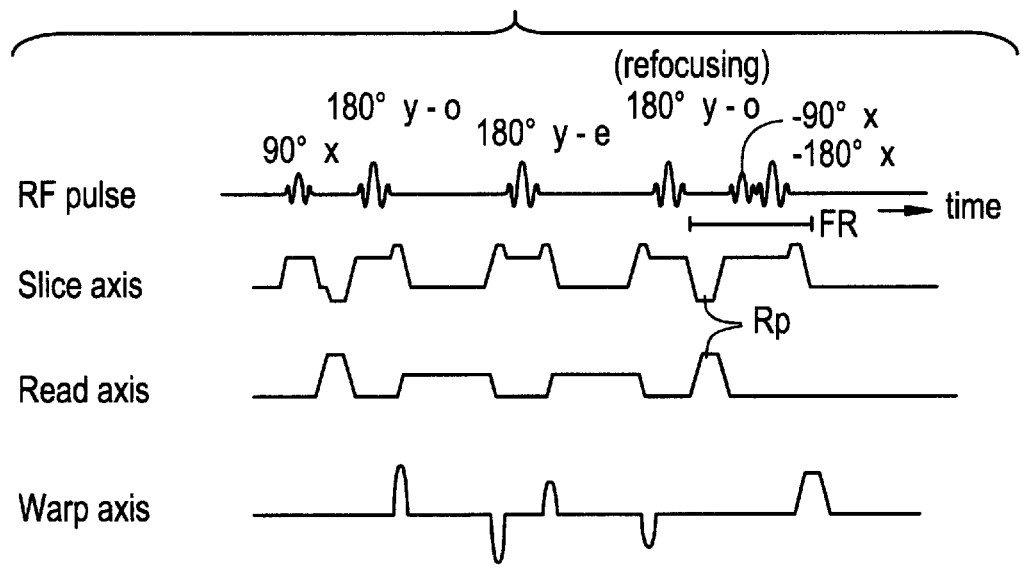
FIG. 7 is a diagram illustrating a pulse sequence of the fast spin echo technique (when n is even) in accordance with a third embodiment of the present invention.
Figure 8A:
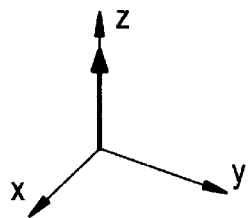
FIG. 8 is an explanatory diagram illustrating the behavior of magnetization in response to the pulse sequence shown in FIG. 7.
Figure 8B:
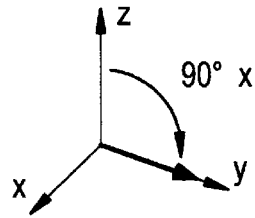
Figure 8C:
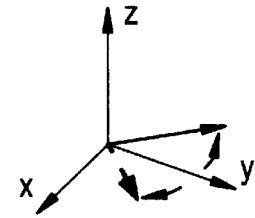
Figure 8D:
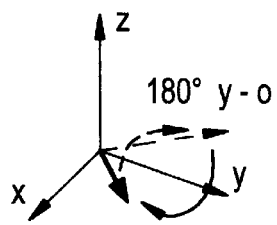
Figure 8E:
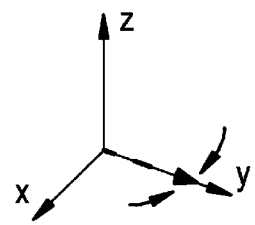
Figure 8F:
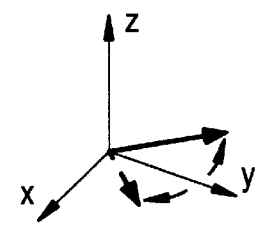
Figure 8G:
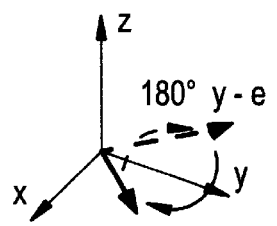
Figure 8H:
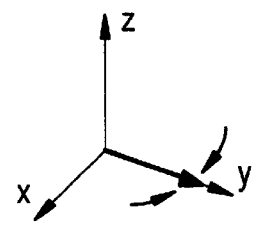
Figure 8I:
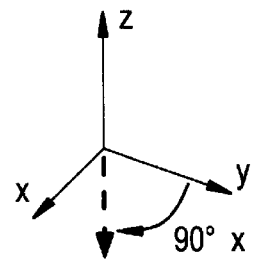
Figure 8J:
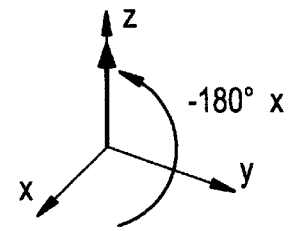

FIG. 7 is a diagram illustrating a pulse sequence in which the forcible recovery pulse is employed in the fast spin echo technique with the number of MR data sets=2.

(1) A selective excitation pulse 90° x which rotates longitudinal magnetization of an object slice for MR data acquisition by 90° around the x-axis to generate transverse magnetization is applied.

(2) A selective inversion pulse 180° y which rotates the transverse magnetization of the object slice for MR data acquisition by 180° around the y-axis is applied and the NMR signal is received. This step is repeated twice. (By "-o" is meant "odd numbered", and by "-e" is meant "even-numbered".)

(3) A selective refocusing pulse 180° y-o which rotates the transverse magnetization of the object slice for MR data acquisition by 180° around the y-axis is applied.

(4) As the forcible recovery pulse sequence FR, a rephasing gradient Rp is applied to each of the slice and read axes and subsequently, after the time period of ESP/2 (when the transverse magnetization is focused on the y-axis) from tie selective refocusing pulse 180° y-o, a selective 90° pulse 90° x which rotates the transverse magnetization of the object slice for MR data acquisition by 90° around the x-axis is applied, and then a selective −180° pulse 180° x which rotates the transverse magnetization of the object slice for MR data acquisition by −180° around the x-axis is applied.

The central frequencies and the phases of the selective excitation pulse 90° x, the selective inversion pulse 180° y, the selective refocusing pulse 180° y-o, the selective 90° pulse 90° x and the selective −180° pulse 180° x are determined by the slice locations sloc1–sloc3 and Eqs. (1), (2) and (4), Eqs. (5) and (7), and Eqs. (8), (9) and (11).

FIG. 8 is an explanatory diagram illustrating the behavior of magnetization in response to the pulse sequence shown in FIG. 7.

(a) The magnetization is longitudinal and oriented to the direction of the static magnetic field.

(b) The magnetization becomes transverse and oriented to the y-direction by the selective excitation pulse 90° x.

(c) The transverse magnetization is dephased.

(d) The transverse magnetization is rotated by 180° around the y-axis by the first selective inversion pulse 180° y-o.

(e) The transverse magnetization is focused on the y-axis: The NMR signal is received.

(f) The transverse magnetization is dephased.

(g) The magnetization is rotated by 180° around the y-axis by the second selective inversion pulse 180° y-e.

(h) The transverse magnetization is focused on the y-axis: The NMR signal is received.

• Then this process returns to (c), goes to (d) by the selective refocusing pulse 180° y-o, and then goes to (e).

(i) The transverse magnetization is rotated by 90° around the x-axis by the forcible recovery pulse, i.e., the selective 90° pulse 90° x and the magnetization becomes longitudinal in the −z-direction.

(j) The longitudinal magnetization in the −z-direction is turned back to the longitudinal magnetization in the +z-direction by the forcible recovery pulse, i.e., the selective −180° pulse 180° x.

According to the above-described third embodiment, the forcible recovery pulse can be applied to the multi-slice fast spin echo technique. Furthermore, the time required for forcible recovery can be shortened relative to the pulse sequence shown in FIG. 4.

Other Embodiments

1. The phase $P_{-FR}$ of the −90° pulse which is a forcible recovery pulse may be:

$$P_{-FR} = \Delta P_{180--FR} \text{ and amplitude inversion,} \quad (14')$$

instead of Eq. (14) set out above.

2. Relaxation of the longitudinal magnetization may be made variable by employing an RF pulse having a variable flip angle $\alpha$ (e.g., $\alpha=-60°$) instead of employing the −90° pulse which is a forcible recovery pulse.

3. The present invention may be applied to the case in which the signal-to-noise ratio is improved in a multi-slice manner by repeatedly acquiring the MR data and summing the acquired MR data (NEX). The effect is to shorten the repeat time. This is, for example, advantageous when the single-shot fast spin echo technique is performed in an MRI apparatus of a small magnetic field strength or MRCP scanning (MR imaging of the bile and pancreatic ducts: Magnetic Resonance Cholangio Pancreatography) is performed.

4. In case that the echo planar technique is performed in a multi-slice manner, the present invention can also shorten the repeat time.

5. Moreover, in case that the projection imaging technique is performed in a multi-slice manner, the present invention can shorten the repeat time and improve the frame rate.

Many widely different embodiments of the invention may be configured without departing from the spirit and the scope of the present invention. It should be understood that the present invention is not limited to the specific embodiments described in the specification, except as defined in the appended claims.

What is claimed is:

1. A multi-slice MR imaging method in which a pulse sequence for acquiring N ($\geq 1$) sets of MR data is executed sequentially for M ($\geq 2$) slices whose locations are different and the sequential execution is repeated in a repeat time TR, the method comprising the steps of:

subsequent to each pulse sequence for each slice within the repeat time TR, applying a refocusing pulse selective of only a current slice; and then applying a forcible recovery pulse sequence selective of the current slice.

2. A multi-slice MR imaging method of claim 1, wherein said pulse sequence is according to a fast spin echo technique in which a selective excitation pulse is applied and then n ($\geq 2$) selective inversion pulses are applied while varying a phase encoding gradient to sequentially acquire n sets of MR data which are different in the amount of phase encoding.

3. A multi-slice MR imaging method of claim 2, wherein: when said selective inversion pulses satisfy the CPMG condition or the CP condition and n is even, subsequent to each pulse sequence for each slice in the repeat time TR, a dummy selective inversion pulse is applied, then a dummy read axis gradient is applied without acquiring MR data, then a refocusing pulse selective of only a current slice is applied and, as the forcible recovery pulse sequence selective of only the current slice, a rephasing gradient is applied to each of the slice and read axes and subsequently a selective −90° pulse is applied.

4. A multi-slice MR imaging method of claim 2, wherein: when said selective inversion pulses satisfy the CPMG condition or the CP condition and n is even, subsequent to each pulse sequence for each slice in the repeat time TR, a refocusing pulse selective of only a current slice is applied, then, as the forcible recovery pulse sequence selective of only the current slice, a rephasing gradient is applied to each of the slice and read axes, and subsequently a 90° pulse selective of only the current slice is applied after a time period of ESP/2 from the refocusing pulse, the time period of ESP is from the selective excitation pulse to the time at which the echo is focused, and subsequently a −180° pulse selective of only the current slice is applied.

5. A multi-slice MR imaging method of claim 1, wherein the central frequencies and the phases of said selective excitation pulse, said selective inversion pulses, said refocusing pulse, and said RF pulses in the forcible recovery pulse sequence are varied according to the slice location.

6. An MRI apparatus having multi-slice data acquisition means for executing a pulse sequence for acquiring N ($\geq 1$) sets of MR data sequentially for M ($\geq 2$) slices whose locations are different and repeating the sequential execution in a repeat time TR, the MRI apparatus comprising selective forcible recovery means which, subsequent to each pulse sequence for each slice within the repeat time TR, applies a refocusing pulse selective of only a current slice, and then applies a forcible recovery pulse sequence selective of only the current slice.

7. An MRI apparatus of claim 6, wherein said pulse sequence is according to a fast spin echo technique in which a selective excitation pulse is applied and then n ($\geq 2$) selective inversion pulses are applied while varying a phase encoding gradient to sequentially acquire n sets of MR data which are different in the amount of phase encoding.

8. An MRI apparatus of claim 7, wherein: when said selective inversion pulses satisfy the CPMG condition or the CP condition and n is even, said selective forcible recovery means applies, subsequent to each pulse sequence for each slice in the repeat time TR, a dummy selective inversion pulse, then applies a dummy read axis gradient without acquiring MR data, then applies a refocusing pulse selective of only a current slice and, as the forcible recovery pulse sequence selective of only the current slice, applies a rephasing gradient to each of the slice and read axes and subsequently a selective −90° pulse.

9. An MRI apparatus of claim 7, wherein: when said selective inversion pulses satisfy the CPMG condition or the CP condition and n is even, said selective forcible recovery means applies, subsequent to each pulse sequence for each slice in the repeat time TR, a refocusing pulse selective of only a current slice, then applies, as the forcible recovery pulse sequence selective of only the current slice, a rephasing gradient to each of the slice and read axes, and subsequently a 90° pulse selective of only the current slice after the time period of ESP/2 from the refocusing pulse, the time period of ESP is from the selective excitation pulse to the time at which the echo is focused, and subsequently a −180° pulse selective of only the current slice.

10. An MRI apparatus of claim 6, wherein said multi-slice data acquisition means varies the central frequencies and the phases of said selective excitation pulse and said selective inversion pulses according to the slice location, and said selective forcible recovery means varies the central frequencies and the phases of said refocusing pulse and said RF pulses in the forcible recovery pulse sequence according to the slice location.

* * * * *